United States Patent
Yamasaki et al.

(10) Patent No.: US 8,729,401 B2
(45) Date of Patent: May 20, 2014

(54) WIRING SUBSTRATE AND METHOD OF MANUFACTURING THE SAME

(75) Inventors: Tomoo Yamasaki, Nagano (JP); Michio Horiuchi, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 461 days.

(21) Appl. No.: 13/032,071

(22) Filed: Feb. 22, 2011

(65) Prior Publication Data

US 2011/0220404 A1    Sep. 15, 2011

(30) Foreign Application Priority Data

Mar. 11, 2010    (JP) .................. 2010-054149

(51) Int. Cl.
| | | |
|---|---|---|
| *H05K 1/03* | (2006.01) | |
| *H05K 1/16* | (2006.01) | |
| *H05K 1/11* | (2006.01) | |

(52) U.S. Cl.
USPC ............ 174/255; 174/260; 174/261; 174/262

(58) Field of Classification Search
CPC ............. H05K 3/46; H05K 1/02; H05K 1/11; H05K 3/40; H05K 3/00
USPC .................................................. 174/255–266
See application file for complete search history.

(56) References Cited

U.S. PATENT DOCUMENTS

| | | | |
|---|---|---|---|
| 3,671,819 A * | 6/1972 | Swanson ....................... 313/365 |
| 4,463,084 A | 7/1984 | Mitsumori | |
| 7,655,292 B2 * | 2/2010 | Kuo ............................... 428/209 |
| 7,868,257 B2 * | 1/2011 | Kushta et al. ................. 174/262 |
| 2008/0230260 A1 * | 9/2008 | Shih ............................... 174/257 |
| 2009/0180225 A1 * | 7/2009 | Pan et al. ........................ 361/56 |
| 2009/0252950 A1 * | 10/2009 | Liaw et al. .................. 428/319.1 |

FOREIGN PATENT DOCUMENTS

| | | |
|---|---|---|
| JP | 58-137915 | 8/1983 |
| JP | 58-141595 | 8/1983 |
| JP | 2004-273480 A1 | 9/2004 |
| JP | 2009-147241 A1 | 7/2009 |

* cited by examiner

*Primary Examiner* — Hoa C Nguyen
(74) *Attorney, Agent, or Firm* — Kratz, Quintos & Hanson, LLP

(57) ABSTRACT

A wiring substrate includes a composite substrate including an oxidized aluminum substrate portion in which a large number of penetration conductors penetrating in a thickness direction are provided, and a frame-like aluminum substrate portion provided around the oxidized aluminum substrate portion, and a wiring layer of n layers (n is an integer of 1 or more) connected to the penetration conductors.

4 Claims, 11 Drawing Sheets

(reduced plan view)

(fragmental plan view)

(fragmental plan view)

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2010-054149, filed on Mar. 11, 2010; the entire contents of which are incorporated herein by reference.

FIELD

It is related to a wiring substrate including a large number of penetration conductors that enable the conduction between upper and lower surface sides of the substrate, and a method of manufacturing the same.

BACKGROUND

In the prior art, there exists the multilayer wiring substrate for mounting a semiconductor chip. In the multilayer wiring substrate, the build-up wiring is formed on both surface sides of the core substrate, and also the chip connection pads for mounting the semiconductor chip are provided on one surface and the external connection pads are provided on the other surface.

In Patent Literature 1 (Japanese Laid-open Patent Publication No. 2004-273480), it is set forth that the wiring substrate is constructed based on such a manner that the conductive material is buried in the through holes, which are located in the area where the electrodes are arranged, out of a large number of through holes in the porous oxidized aluminum formed by the anodic oxidizing method, whereas the insulating material is buried in the through holes located in the area except it.

In Patent Literature 2 (Japanese Laid-open Patent Publication No. 2009-147241), it is set forth that the circuit substrate is constructed by forming the insulating layer, in which the opening portions to expose the selected through-hole conductors are provided, on both surfaces of the porous alumina substrate having a plurality of through-hole conductors, and then forming the wirings which are connected to the through-hole conductors in the opening portions.

As described later, in the related art, the wiring substrate is manufactured based on such a manner that the build-up wiring is formed on the thin oxidized aluminum substrate in which a large number of penetration conductors are provided. The oxidized aluminum substrate including a large number of penetration conductors is in a fragile condition because rigidity of the substrate is weak.

As a result, when the build-up wiring layer is formed on the oxidized aluminum substrate, cracks easily occur in the oxidized aluminum substrate.

Also, the fine penetration conductors are provided up to the edge part of the oxidized aluminum substrate. As a result, when a mechanical impact is given during the manufacturing step, or the like, in some cases the penetration conductors fall to peel off from the edge part of the oxidized aluminum substrate.

SUMMARY

According to one aspect discussed herein, there is provided a wiring substrate, which includes an oxidized aluminum substrate portion in which a large number of penetration conductors penetrating in a thickness direction are provided, and a frame-like aluminum substrate portion provided around the oxidized aluminum substrate portion, and a wiring layer of n layers (n is an integer of 1 or more) connected to the penetration conductors.

According to another aspect discussed herein, there is provided a method of manufacturing a wiring substrate, which includes preparing a composite substrate, which includes a plurality of oxidized aluminum substrate portions in each of which a large number of penetration conductors which penetrate in a thickness direction are provided, and an aluminum substrate portion which couples the plurality of oxidized aluminum substrate portions, and forming a wiring layer of n layers (n is an integer of 1 or more) connected to the penetration conductors.

DESCRIPTION OF EMBODIMENTS

Embodiments of the present invention will be explained with reference to the accompanying drawings hereinafter.

(Related Art)

Prior to the explanation of respective embodiments, the related art (preliminary matter) will be explained hereunder. FIG. 1A to FIG. 3C are sectional views depicting a method of manufacturing a wiring substrate in the related art.

Figure 1A:
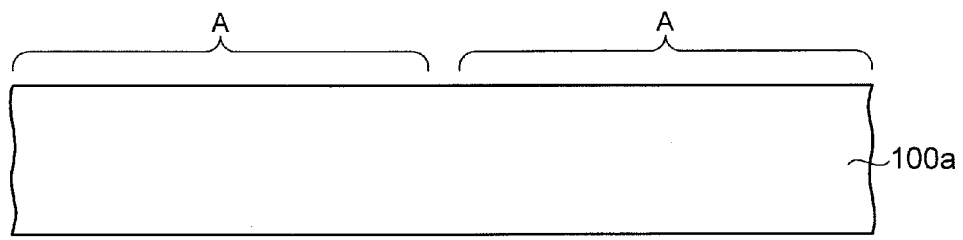
FIGS. 1A to 1D are sectional views (#1) depicting a method of manufacturing a wiring substrate in the related art.

In the method of manufacturing the wiring substrate in the related art, as depicted in FIG. 1A, first, an aluminum (Al) substrate 100a is prepared.

The aluminum substrate 100a is the multi production substrate, and a plurality of wiring substrate regions A are defined thereon.

Figure 1B:
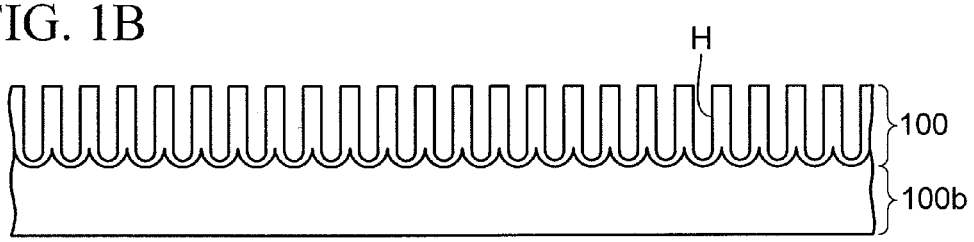

Then, as depicted in FIG. 1B, an oxidized aluminum substrate 100 is obtained by anodizing the aluminum substrate 100a from the surface side. At this time, a large number of fine holes H are formed simultaneously from the whole surface of the oxidized aluminum substrate 100 toward the thickness direction. Also, such a situation is obtained that an aluminum portion 100b that is not anodized is left to the lower side of the oxidized aluminum substrate 100.

Figure 1C:

Then, as depicted in FIG. 1C, the aluminum portion 100b which is left to the lower side of the oxidized aluminum substrate 100 is removed by the etching. Accordingly, the oxidized aluminum substrate 100 in which a large number of through holes TH each of which penetrates the substrate from the upper surface to the lower surface are provided side by side in the lateral direction is obtained. The oxidized aluminum substrate 100 is formed as the thin type substrate whose thickness is about 100 µm.

Figure 1D:
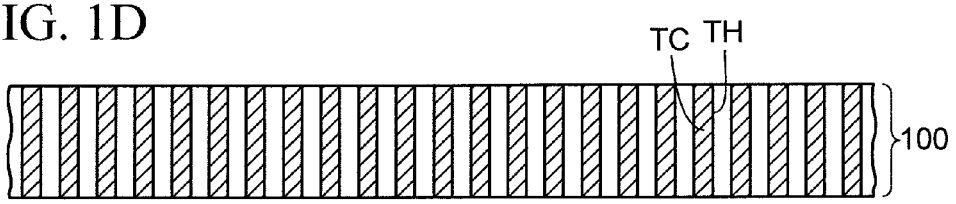

Then, as depicted in FIG. 1D, a plating power feeding layer (not shown) is arranged on the lower surface of the oxidized aluminum substrate 100 in which a large number of through holes TH are provided. Then, the copper plating is applied to the inside of the through holes TH from the bottom part to the upper part by the electroplating. Thus, a penetration conductor TC is filled in the through holes TH respectively.

Accordingly, the oxidized aluminum substrate 100 in which the penetration conductor TC (linear conductor) is filled in a large number of through holes TH respectively is obtained.

Figure 2A:
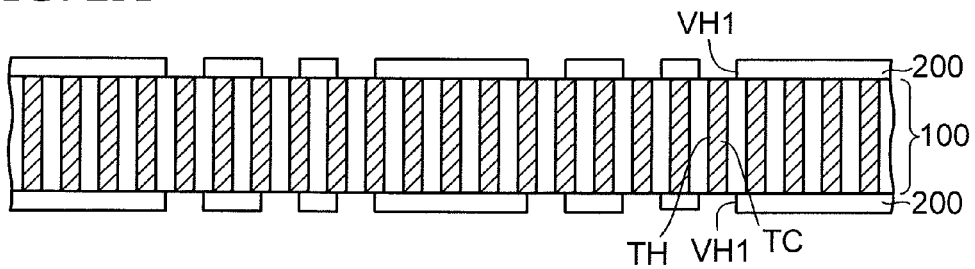
FIGS. 2A to 2C are sectional views (#2) depicting the method of manufacturing the wiring substrate in the related art.

Then, as depicted in FIG. 2A, a first interlayer insulating layer 200 made of an insulating resin is formed on both surface sides of the oxidized aluminum substrate 100 respectively. Also, the first interlayer insulating layer 200 formed on both surface sides respectively is processed by the $CO_2$ laser, and thus first via holes VH1 each reaching the both end part of the penetration conductor TC are formed respectively. A plurality of penetration conductors TC arranged in the first via holes VH1 function as the penetration vias which penetrate to the both surface sides of the oxidized aluminum substrate 100.

Figure 2B:
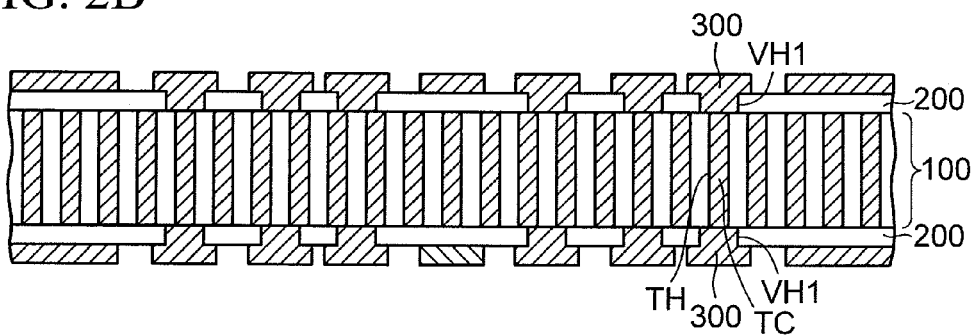

Then, as depicted in FIG. 2B, first wiring layers 300 each connected to the penetration conductor TC via the first via hole VH1 are formed on the first interlayer insulating layer 200 on both surface sides respectively. The first wiring layers 300 formed on both surface sides are connected mutually via the penetration conductor TC.

Figure 2C:
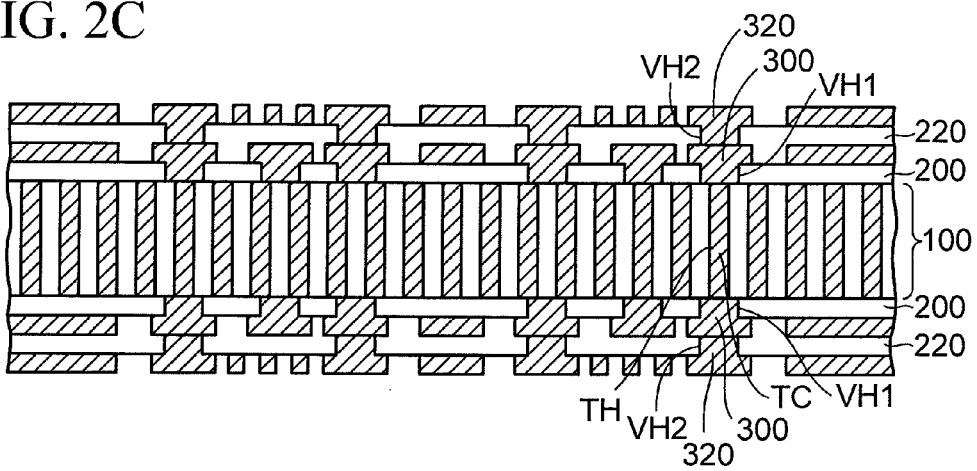

Then, as depicted in FIG. 2C, a second interlayer insulating layer 220, in which second via holes VH2 each reaching the connection part of the first wiring layer 300 are provided, is formed on both surface sides of the oxidized aluminum substrate 100 by the similar method respectively. Then, second wiring layers 320 each connected to the first wiring layer 300 via the second via hole VH2 are formed on the second interlayer insulating layer 220 on both surface sides respectively.

Figure 3A:
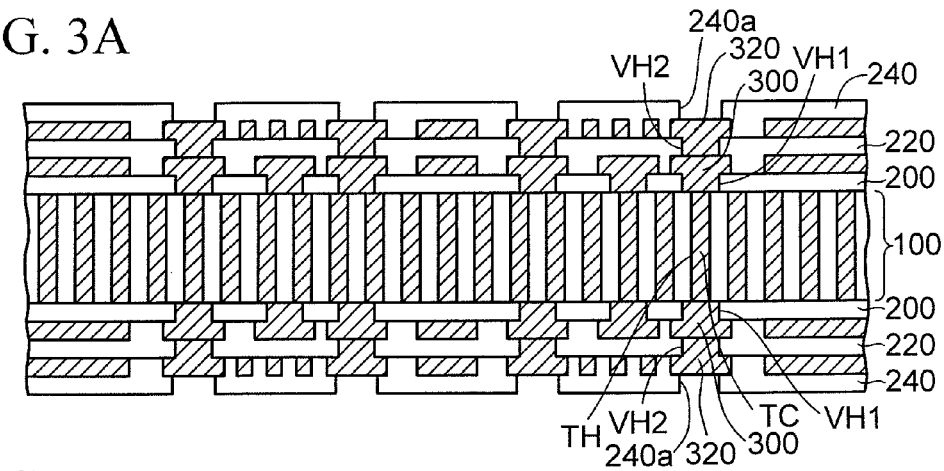
FIGS. 3A to 3C are sectional views (#3) depicting the method of manufacturing the wiring substrate in the related art.

Then, as depicted in FIG. 3A, a solder resist 240, in which an opening portion 240a is provided on the connection parts of the second wiring layers 320 respectively, is formed on both surface sides of the oxidized aluminum substrate 100 respectively.

Figure 3B:
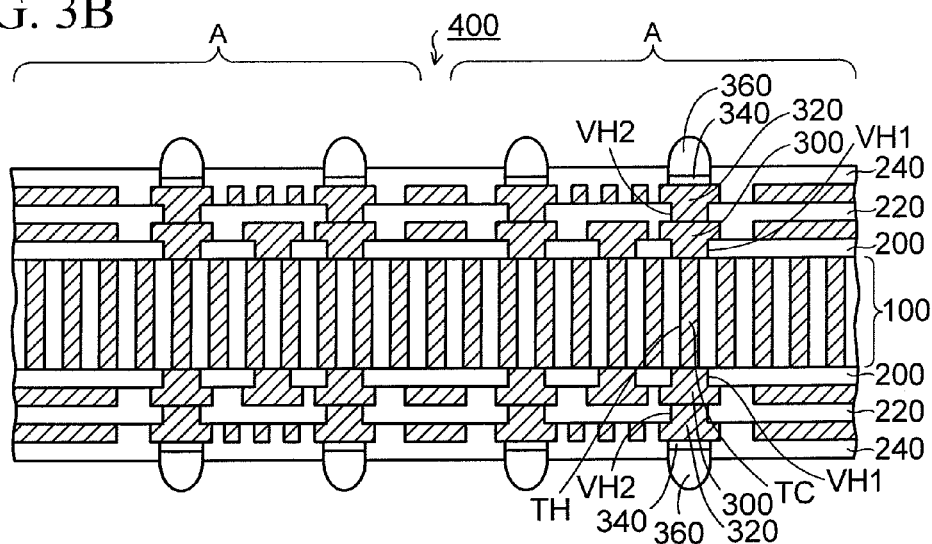

Then, as depicted in FIG. 3B, a nickel/gold plating layer is formed on the connection parts of the second wiring layers 320 on both surface sides of the oxidized aluminum substrate 100 respectively, and thus contact layers 340 are obtained respectively. Then, a solder bump 360 connected to the second wiring layer 320 is formed in the opening portions 240a in the solder resist 240 on both surface sides of the oxidized aluminum substrate 100 respectively.

Accordingly, a wiring member 400 constructed such that a build-up wiring layer is formed in a plurality of wiring substrate regions A of the oxidized aluminum substrate 100 respectively is obtained.

Figure 3C:
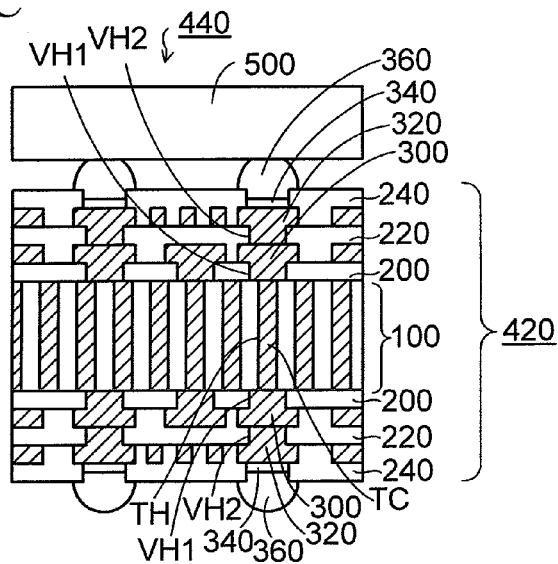

Then, as depicted in FIG. 3C, individual wiring substrates 420 are obtained by cutting the wiring member 400 in FIG. 3B between the wiring substrate regions A. The connection parts of a semiconductor chip 500 are flip-chip connected to the solder bumps 360 of the wiring substrate 420. Accordingly, a semiconductor package 440 constructed such that the semiconductor chip 500 is mounted on the wiring substrate 420 is obtained.

As described above, in the method of manufacturing the wiring substrate in the related art, the wiring substrate 420 is manufactured based on such a manner that the build-up wiring layer is formed on the thin oxidized aluminum substrate 100 in which a large number of penetration conductors TC are provided. Since the oxidized aluminum substrate 100 is made thin to have a thickness of about 100 µm and also has such a structure that the penetration conductors TC are provided over the whole surface, rigidity of the substrate is weak and also the substrate is in a fragile condition.

Therefore, when the build-up wiring layer is formed on both surface sides of the oxidized aluminum substrate 100, cracks easily occur in the oxidized aluminum substrate 100. Also, the enough substrate strength cannot be obtained even after the semiconductor package 440 is constructed by mounting the semiconductor chip 500 on the wiring substrate 420.

Further, the fine penetration conductors TC are provided up to the outer edge parts of the oxidized aluminum substrate 100. Therefore, when a mechanical impact is given during the manufacturing step and after the semiconductor package is constructed, in some cases the penetration conductors TC fall to peel off from the outer edge part of the oxidized aluminum substrate 100.

In this manner, in the method of manufacturing the wiring substrate in the related art, it is difficult to obtain a satisfactory manufacturing yield, and also it is feared that reliability of the wiring substrate and the semiconductor package becomes an issue.

Respective wiring substrates of embodiments explained hereinafter can solve such disadvantages.

(First Embodiment)

Figure 6A:
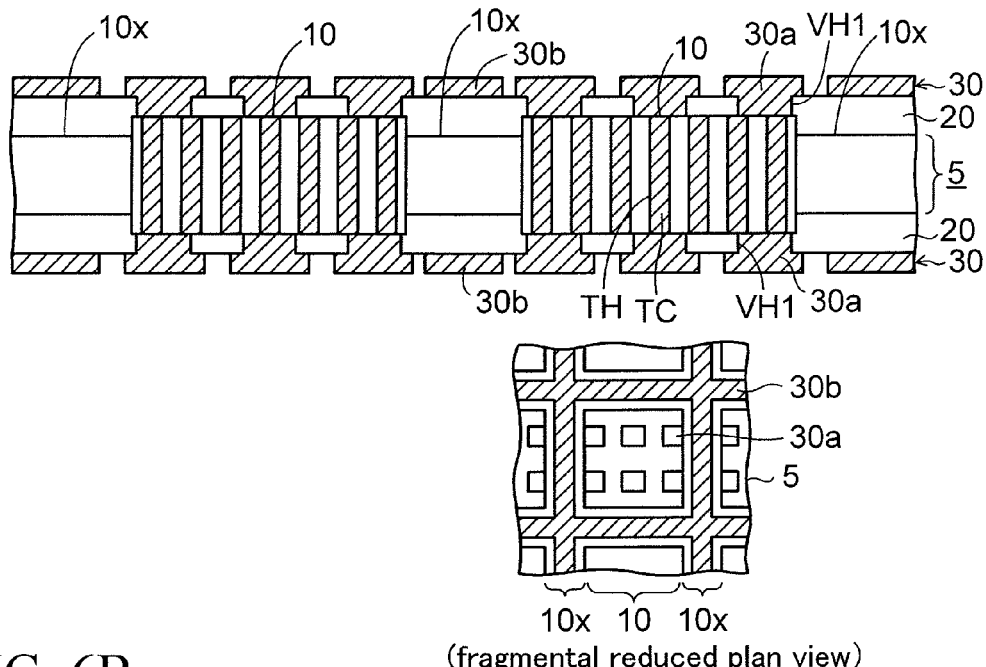
FIGS. 6A to 6C are sectional views (#3) depicting the method of manufacturing the wiring substrate according to the first embodiment.
Figure 6B:
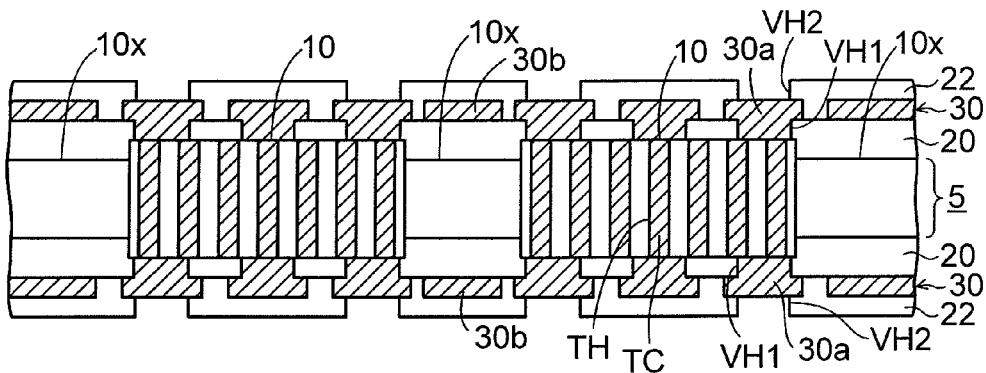
Figure 6C:
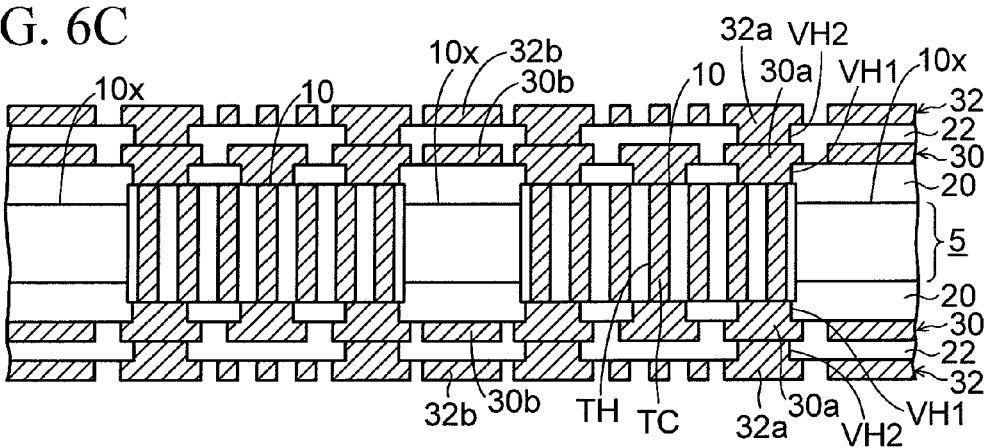
Figure 7A:
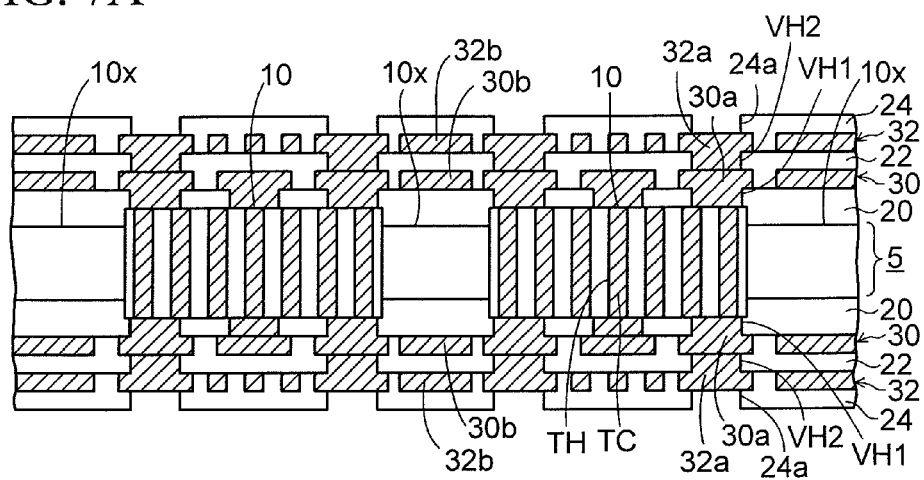
FIGS. 7A and 7B are sectional views (#4) depicting the method of manufacturing the wiring substrate according to the first embodiment.
Figure 7B:
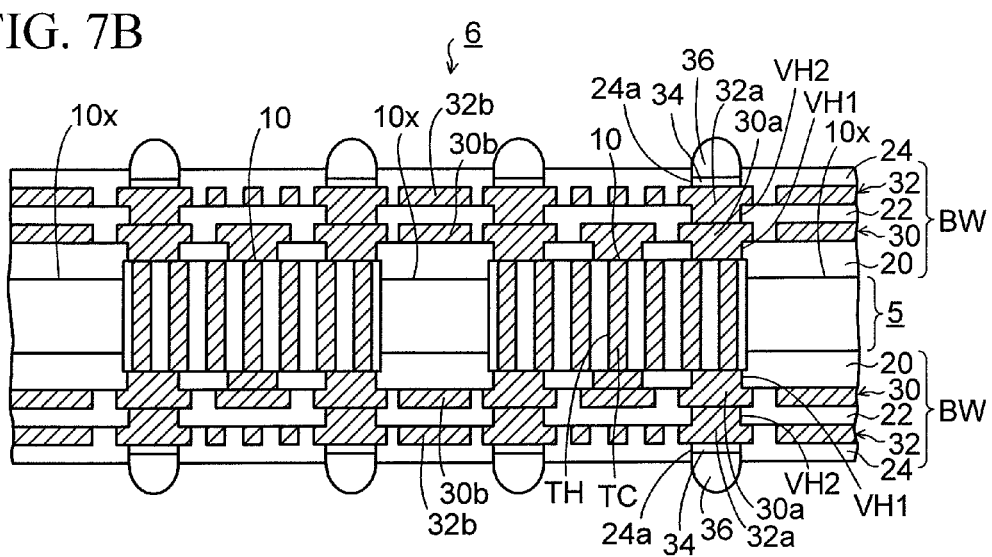
Figure 8:
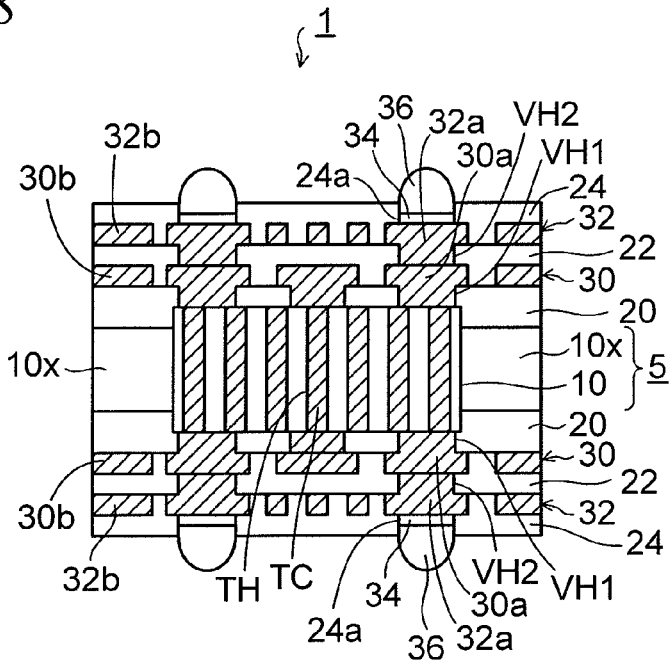
FIG. 8 is a sectional view depicting a wiring substrate according to the first embodiment.
Figure 9:
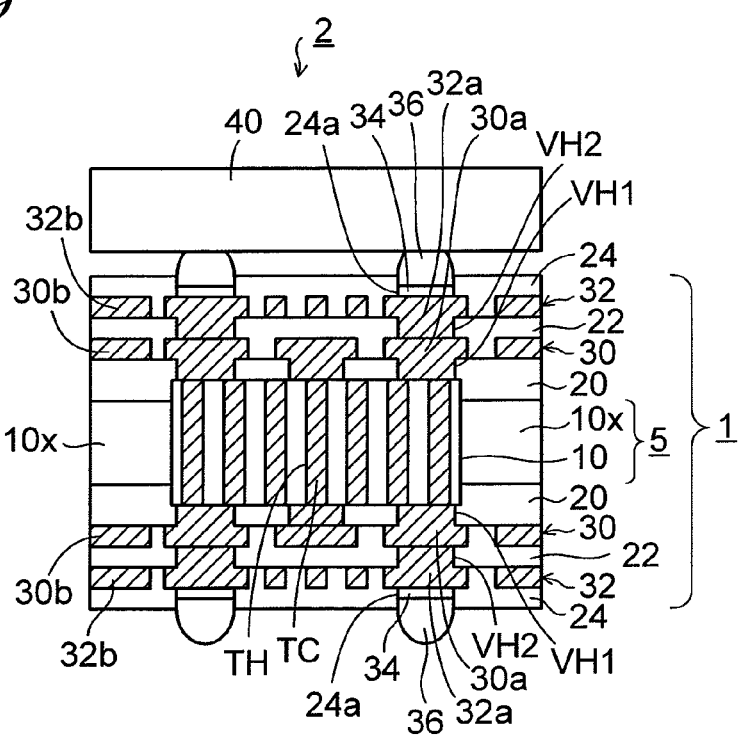
FIG. 9 is a sectional view depicting a semiconductor package according to the first embodiment.

FIG. 4A to FIG. 7B are sectional views depicting a method of manufacturing a wiring substrate according to a first embodiment, FIG. 8 is a sectional view depicting a wiring substrate according to the first embodiment, and FIG. 9 is a sectional view depicting a semiconductor package according to the first embodiment.

Figure 4A:
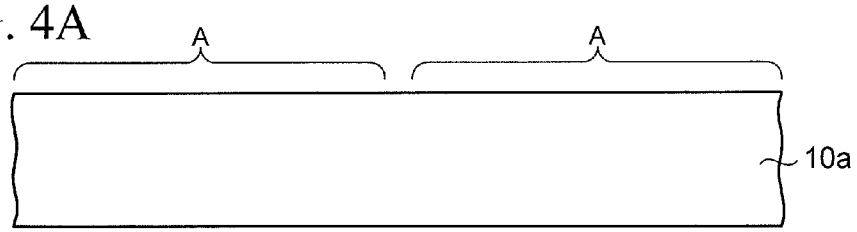
FIGS. 4A to 4D are sectional views (#1) depicting a method of manufacturing a wiring substrate according to a first embodiment.

In the method of manufacturing the wiring substrate according to the first embodiment, as depicted in FIG. 4A, first, an aluminum (Al) substrate 10a is prepared. The aluminum substrate 10a is the multi production substrate, and a plurality of wiring substrate regions A are defined thereon. In FIG. 4A, two wiring substrate regions A are illustrated, but any number of wiring substrate regions A may be defined.

Figure 4B:
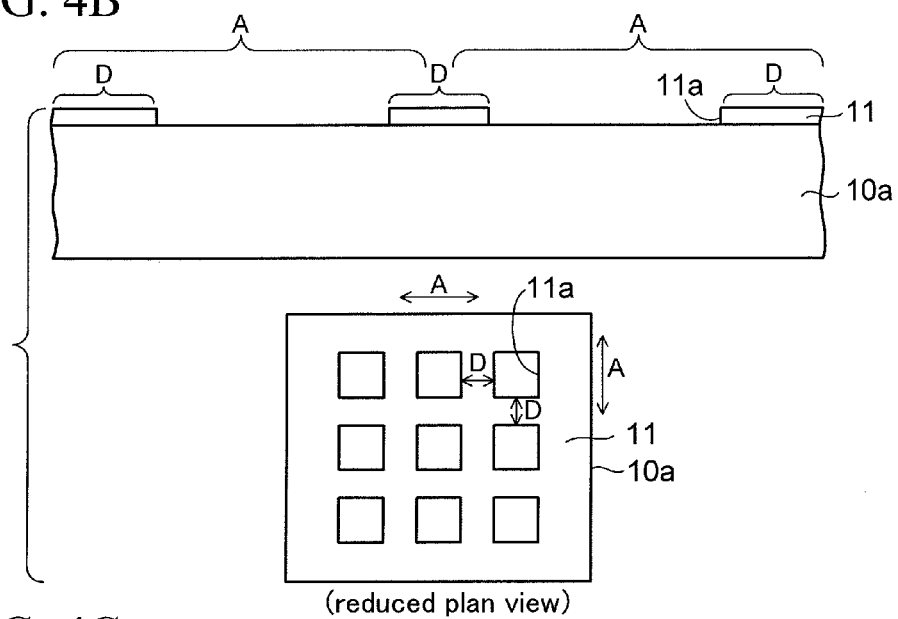

Then, as depicted in FIG. 4B, an insulating resin layer 11 in which an opening portion 11a is provided in center principal portions of the wiring substrate regions A respectively is formed on the aluminum substrate 10a. The opening portions 11a of the insulating resin layer 11 are arranged in regions that are to be anodized in the aluminum substrate 10a.

The insulating resin layer 11 in which the opening portions 11a are provided is obtained by forming a photosensitive epoxy resin, or the like on the aluminum substrate 10a, and then exposing/developing the resin by means of the photolithography. Preferably a photoresist is employed as the insulating resin layer 11.

Otherwise, as the insulating resin layer 11, an adhesive tape in which opening portions are provided in advance may be pasted onto the aluminum substrate 10a.

As depicted in a reduced plan view in FIG. 4B, the opening portions 11a of the insulating resin layer 11 are arranged such that the pattern of the insulating resin layer 11 is formed in grid-like fashion. And respective regions located between the opening portions 11a are used as dicing regions D, and the dicing regions D are covered with the insulating resin layer 11. The dicing regions D are used as the cutting regions for obtaining individual wiring substrates by cutting the multi production substrate.

Figure 4C:
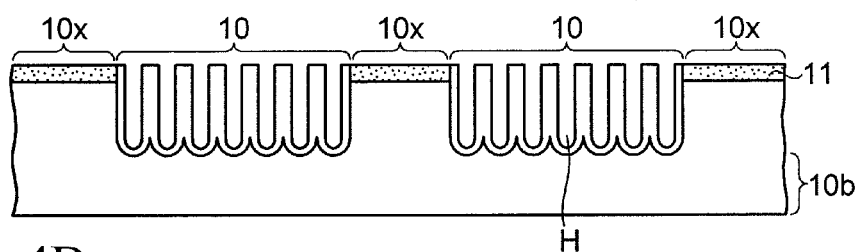

Then, as depicted in FIG. 4C, the electrolysis using the aluminum substrate 10a as the anode is applied in a treatment bath such as an oxalic acid solution, or the like. Accordingly, the aluminum substrate 10a in the opening portions 11a of the insulating resin layer 11 is anodized in the thickness direction, and thus an oxidized aluminum substrate portion 10 is obtained.

Depending on the conditions of the anodic oxidation, in some cases the oxidized aluminum may grow in the lower side of the insulating resin layer 11. Such growth can be suppressed by optimizing the conditions of the anodic oxidation.

At this time, the aluminum substrate 10a is made porous by the anodic oxidation. Therefore, a large number of fine holes H are formed simultaneously from the surface of the oxidized aluminum substrate portion 10 in the opening portions 11a of the insulating resin layer 11 toward the thickness direction.

Also, such a situation is obtained that a thin aluminum portion 10b that is not anodized is left in the lower side of the oxidized aluminum substrate portion 10.

Since respective regions (dicing regions D) of the aluminum substrate 10a, where are covered with the insulating resin layer 11, are not anodized, such portions are left as an aluminum substrate portion 10x from the upper surface to the lower surface.

Figure 4D:
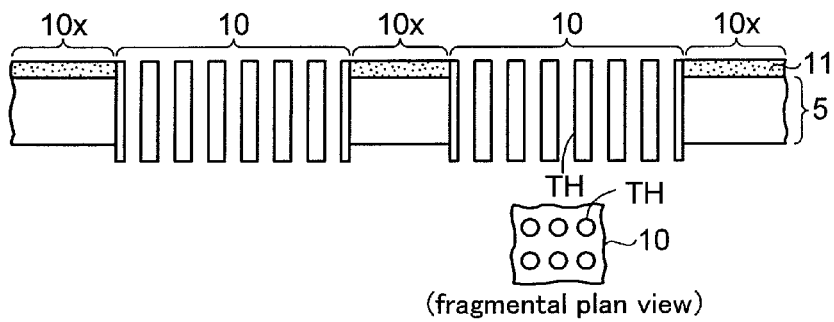

Then, as depicted in FIG. 4D, the aluminum portion 10b left in the lower side of the oxidized aluminum substrate portion 10 is removed by the etching until the holes H are exposed.

Accordingly, the oxidized aluminum substrate portion 10 in which a large number of through holes TH which penetrate from the upper surface to the lower surface are provided side by side in the lateral direction is obtained, and simultaneously the aluminum substrate portion 10x is coupled between a plurality of oxidized aluminum substrate portions 10.

As depicted in a fragmental plan view in FIG. 4D, a large number of through holes TH are arranged side by side in the substrate direction in such a state that these holes are separated mutually via the oxidized aluminum substrate portion 10.

As the preferred embodiment, a thickness of the oxidized aluminum substrate portion 10 is set to about 70 to 120 μm, a diameter of the through hole TH is set to 60 to 200 nm, and a pitch of the through holes TH is set to 100 to 300 nm.

In this manner, the oxidized aluminum substrate portion 10 in which a large number of through holes TH are provided is arranged in the areas corresponding to the opening portions 11a of the insulating resin layer 11 respectively, and the non-oxidized aluminum substrate portion 10x is arranged in the areas corresponding to the dicing regions D respectively.

With the above, a composite substrate 5 having such a structure that a plurality of oxidized aluminum substrate portions 10 are coupled mutually via the aluminum substrate portion 10x is obtained.

As explained in the related art, substrate strength of the oxidized aluminum substrate portion in which a large number of through holes TH are provided over the whole area is weak, thus the cracks easily occur in the later manufacturing steps. In the present embodiment, a plurality of oxidized aluminum substrate portions 10 are coupled mutually by the aluminum substrate portion 10x whose substrate strength is relatively strong. Therefore, the strength in the whole substrate is reinforced, and such an event is prevented that the cracks are caused in the later manufacturing steps.

Here, in the anodic oxidizing step in FIG. 4C, the aluminum substrate 10a may be anodized in such a state that a protection metal layer (not shown) is formed on the lower surface of the aluminum substrate 10a. In this case, the anodic oxidation can be applied to the part closer to the lower surface of the aluminum substrate 10a. Then, the protection metal layer and the aluminum portion 10b are removed by the etching.

Also, in place of the aluminum substrate 10a, a tantalum (Ta) substrate or a titanium (Ti) substrate may be employed. In this case, the composite substrate, in which a plurality of oxidized tantalum substrate portions (or oxidized titanium substrate portions) are coupled mutually by a tantalum substrate portion (or a titanium substrate portion), is obtained by carrying out the similar steps.

Figure 5A:
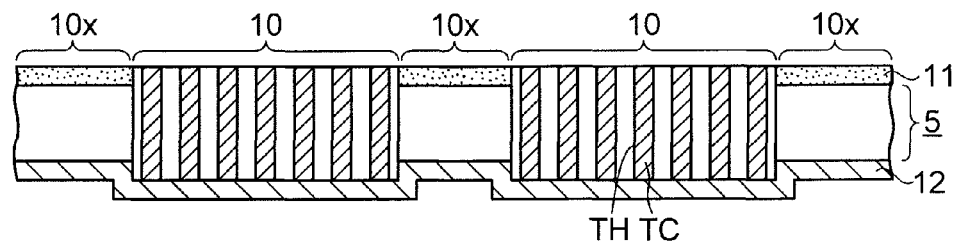
FIGS. 5A to 5D are sectional views (#2) depicting the method of manufacturing the wiring substrate according to the first embodiment.

Then, as depicted in FIG. 5A, a plating power feeding layer 12 is formed on the opposite surface side to the surface of the composite substrate 5 on which the insulating resin layer 11 is formed. As the plating power feeding layer 12, either a copper foil, or the like may be temporarily adhered or a titanium (Ti) layer/a copper (Cu) layer may be formed in sequence from the bottom by the sputter method.

Then, the copper (Cu) plating is applied to respective insides of the through holes TH in the oxidized aluminum substrate portion 10 from the bottom part to the top part by the electroplating utilizing the plating power feeding layer 12 as a plating power feeding path. Thus, a penetration conductor TC (linear conductor) is filled in the through holes TH respectively. Here, the penetration conductors TC may be formed of nickel by applying the nickel (Ni) plating in place of the copper plating.

Otherwise, the penetration conductor TC can be filled selectively in the through holes TH in the oxidized aluminum substrate portion 10 by applying the electroless plating in place of the electroplating.

Figure 5B:
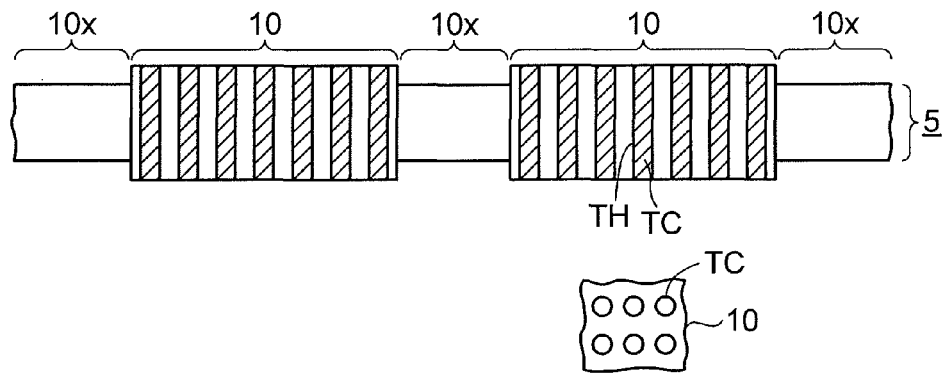

Then, as depicted in FIG. 5B, the plating power feeding layer 12 is removed from the composite substrate 5. Then, the insulating resin layer 11 formed on the composite substrate 5 is removed. In the case that the photoresist is employed as the insulating resin layer 11, the insulating resin layer 11 is removed by applying the ashing or an organic solvent (resist stripper). Alternatively, in the case that an adhesive tape is employed as the insulating resin layer 11, such adhesive tape is peeled off.

Accordingly, the composite substrate 5 which includes a plurality of oxidized aluminum substrate portions 10 in which a large number of penetration conductors TC are provided, and the aluminum substrate portions 10x which couple the oxidized aluminum substrate portions 10 is obtained. As depicted in a fragmental plan view of FIG. 5B, a large number of penetration conductors TC are arranged side by side in the substrate direction in such a state that these conductors TC are insulated mutually with the oxidized aluminum substrate portion 10 (insulator).

The aluminum substrate portion 10x of the composite substrate 5 reinforces the oxidized aluminum substrate portion 10 whose substrate strength is weak in the later manufacturing steps, and also the aluminum substrate portion 10x is left as a frame-like stiffener (reinforcing plate) to the outer edge side of the wiring substrate after the aluminum substrate 10a is cut along the dicing region D (FIG. 4B).

Next, a method of forming a build-up wiring layer on both surface sides of the composite substrate 5 having such structure will be explained hereunder.

Figure 5C:
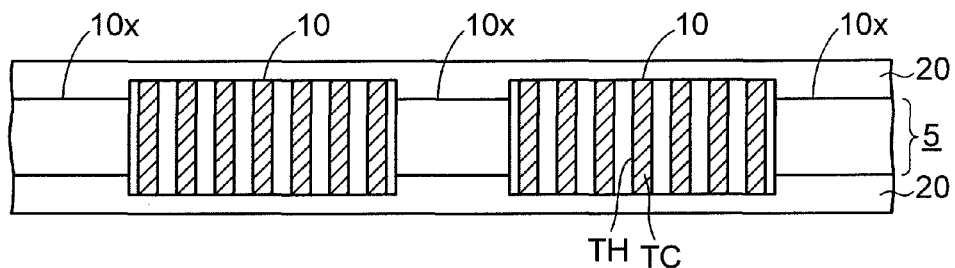

Then, as depicted in FIG. 5C, first, a first interlayer insulating layer 20 formed of an insulating resin such as epoxy resin, polyimide resin, or the like is formed on both surface sides of the composite substrate 5 respectively. A film thickness of the first interlayer insulating layer 20 is set to 20 to 40 μm.

Figure 5D:
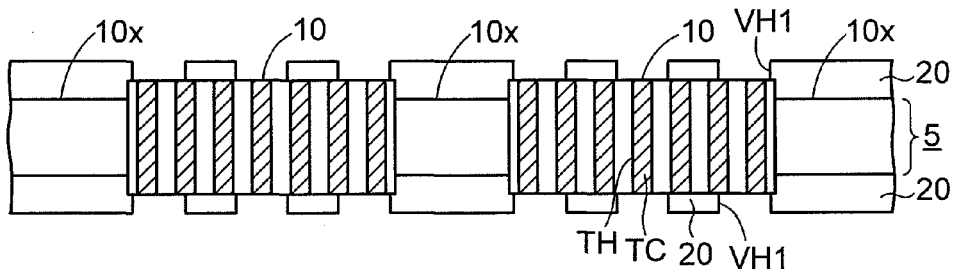

Then, as depicted in FIG. 5D, the first interlayer insulating layer 20 is processed on both surface sides of the composite substrate 5 by the $CO_2$ laser. Thus, first via holes VH1 each reaching an upper end or a lower end of the penetration conductor TC provided in the oxidized aluminum substrate portion 10 are formed respectively. A plurality of penetration conductors TC which are arranged in the first via holes VH1 in the first interlayer insulating layer 20 function as the penetration vias that enable the conduction between upper and lower surface sides of the composite substrate 5.

Otherwise, a photosensitive insulating resin may be formed on both surface sides of the composite substrate 5, and then the first via holes VH1 may be formed by exposing/developing the photosensitive insulating resin by means of the photolithography.

In the present embodiment, the first via holes VH1 in the first interlayer insulating layer are arranged in any positions of the oxidized aluminum substrate portion 10 in which a large number of penetration conductors TC are provided in advance. Therefore, the penetration via structure that enable the conduction between both surface sides can be easily constructed. As a result, the high-density connection via structure can be formed at a low cost without restriction of layout of the penetration vias.

Then, as depicted in FIG. 6A, first wiring layers 30 each connected to upper ends or lower ends of the penetration conductors TC via the first via holes VH1 are formed on both surface sides of the first interlayer insulating layer 20 respectively. The first wiring layers 30 are formed by the semi-additive process, for example.

To explain in detail, a seed layer (not shown) is formed on the first interlayer insulating layer 20 and in the first via holes VH1 on both surface sides of the composite substrate 5. As the seed layer, a laminated film in which a titanium (Ti) layer whose film thickness is 50 nm and a copper layer whose film thickness is 500 nm are laminated in order from the bottom is used.

Then, a plating resist (not shown), in which opening portions are provided in parts where the first wiring layer 30 is arranged, is formed on the seed layer. In subsequent, a metal plating layer (not shown) is formed in the opening portions by the electroplating utilizing the seed layer as a plating power feeding path. As the metal plating layer, a copper layer whose film thickness is about 20 μm is used.

Then, the plating resist is removed, and then the seed layer is etched while using the metal plating layer as a mask. Thus, the first wiring layer 30 constructed by the seed layer and the metal plating layer is obtained.

In the connection part of the first wiring layer 30 and the penetration conductors TC, the first wiring layer 30 is connected electrically to a plurality of penetration conductors TC.

Also, the first wiring layer 30 is formed to include first wiring portions 30a and first substrate reinforcing electrode portions 30b. The first wiring portion 30a is arranged on both surface sides corresponding to the oxidized aluminum substrate portion 10 and is connected to the penetration conductors TC. The first substrate reinforcing electrode portion 30b is arranged via the first interlayer insulating layer 20 on both surface sides corresponding to the aluminum substrate portion 10x.

The first substrate reinforcing electrode portions 30b are formed to be separated from the first wiring portions 30a, and are formed as the floating electrode that is not connected to the electric circuit which is constructed by the penetration conductor TC, the first wiring portion 30a, and the like.

As depicted in a fragmental reduced plan view of FIG. 6A, the first substrate reinforcing electrode portions 30b (hatched portions) are arranged in the parts corresponding to the aluminum substrate portions 10x in a state that these portions are connected to surround a plurality of oxidized aluminum substrate portions 10. That is, when viewed from the top, the first substrate reinforcing electrode portions 30b are formed with a grid-like pattern that is smaller by one size than the aluminum substrate portions 10x which are arranged with a grid-like pattern.

The first substrate reinforcing electrode portions 30b are arranged in grid-like fashion on both surface sides of the aluminum substrate portion 10x, thus substrate strength of the composite substrate 5 can be improved further more.

The first substrate reinforcing electrode portions 30b may be arranged separately mutually, but substrate strength can be reinforced much more by arranging the substrate reinforcing electrode portions with a ring-like connected pattern.

Then, as depicted in FIG. 6B, a second interlayer insulating layer 22 in which second via holes VH2 are provided on the first wiring layer 30 is formed on both surface sides of the composite substrate 5 respectively by the similar method.

Then, as depicted in FIG. 6C, second wiring layers 32 each connected to the first wiring layer 30 via the second via holes VH2 are formed on both surface sides of the second interlayer insulating layer 22 by the similar method.

Like the first wiring layer 30, the second wiring layer 32 is formed to include second wiring portions 32a and second substrate reinforcing electrode portions 32b. The second wiring portion 32a is arranged on both surface sides corresponding to the oxidized aluminum substrate portion 10, and is connected to the first wiring portions 30a of the first wiring layer 30 via the second via holes VH2. Also, the second substrate reinforcing electrode portion 32b is arranged on both surface sides corresponding to the aluminum substrate portions 10x via the second interlayer insulating layer 22.

Like the first wiring layer 30, it is preferable that the second substrate reinforcing electrode portions 32b of the second wiring layer 32 should be arranged with a ring-like connected pattern on the parts corresponding to the aluminum substrate portions 10x. Also similarly, the second substrate reinforcing electrode portions 32b of the second wiring layer 32 are not connected to the electric circuit and are formed as the floating electrode.

The first substrate reinforcing electrode portions 30b of the first wiring layer 30 and the second substrate reinforcing electrode portions 32b of the second wiring layer 32 are stacked on both surface sides of the aluminum substrate portions 10x, thus substrate strength of the composite substrate 5 can be improved further more.

Since the first and second substrate reinforcing electrode portions 30b, 32b of the first and second wiring layers 30, 32 are not connected to the electric circuit, there is not necessity to connect these reinforcing electrode portions mutually with the second via hole VH2. Therefore, the first and second substrate reinforcing electrode portions 30b, 32b are formed in a state that they are electrically insulated mutually by the second interlayer insulating layer 22. In this case, the first substrate reinforcing electrode portion 30b and the second substrate reinforcing electrode portion 32b may be connected via the second via hole VH2.

Then, as depicted in FIG. 7A, a solder resist 24 in which an opening portion 24a is provided on the connection parts of the second wiring layers 32 respectively is formed on both surface sides of the composite substrate 5. A film thickness of the solder resist 24 is about 20 μm.

Then, as depicted in FIG. 7B, a contact layer 34 is formed on the connection parts of the second wiring layers 32 respectively on both surface sides of the composite substrate 5. As a preferred example of the contact layer 34, a nickel layer whose film thickness is set to about 3 μm and a gold (Au) layer whose film thickness is set to about 0.1 μm are formed in sequence from the bottom by the electroless plating.

Then, bump electrodes 36 each connected to the contact layer 34 on the second wiring layer 32 and made of solder, or the like are formed respectively on both surface sides of the composite substrate 5.

In this manner, a two-layered build-up wiring layer BW connected to the upper ends or the lower ends of the penetration conductors TC is formed respectively on both surface sides of the composite substrate 5.

With the above, a wiring member 6 in which the build-up wiring layer BW is formed in a plurality of wiring substrate regions A (FIG. 4B) of the composite substrate 5 respectively is obtained. In the example in FIG. 7B, the two-layered build-up wiring layer BW (the first and second wiring layers 30, 32) is formed, but the build-up wiring layer can be formed in any n layers (n is an integer of 1 or more) (single layer or stacked layers).

Here, the build-up wiring layer BW may be formed only on one surface side of the composite substrate 5. In this case, the bump electrodes connected to the penetration conductors TC are provided on the surface of the oxidized aluminum substrate portion 10 located on the opposite side to the build-up wiring layer BW.

Then, as depicted in FIG. 8, the wiring member 6 in FIG. 7B is cut in the part corresponding to the aluminum substrate portion 10x (the center part (FIG. 4B) of the dicing region D) from the top surface to the bottom surface. Thus, individual wiring substrates 1 are obtained.

As explained above, in the method of manufacturing the wiring substrate according to the first embodiment, first, the aluminum substrate 10a in which a plurality of wiring substrate regions A are defined is prepared, and then the insulating resin layer 11 in which the opening portion 11a is provided in the areas to be anodized respectively is formed.

Then, the aluminum substrate 10a is anodized in the thickness direction through the opening portions 11a in the insulating resin layer 11. Accordingly, the oxidized aluminum substrate portions 10 in which a large number of fine holes H are provided respectively are formed partially in the aluminum substrate 10a.

Then, the aluminum portion 10b left on the lower side is removed, and thus the through holes TH each of which penetrates the substrate in the thickness direction are provided in the oxidized aluminum substrate portions 10 respectively. Then, the penetration conductor TC is filled in a large number of through holes TH in the oxidized aluminum substrate portions 10 respectively.

By employing such manufacturing method, the oxidized aluminum substrate portion 10 whose substrate strength is weak is reinforced by the aluminum substrate portion 10x whose substrate strength is strong. Therefore, the strength of the whole substrate can be improved rather than the case where the oxidized aluminum substrate is employed over the whole area.

Accordingly, in various steps applied to form the build-up wiring layer BW that is connected to the penetration conductors TC provided in the oxidized aluminum substrate portions 10, such an event can be prevented that the cracks are generated in the oxidized aluminum substrate portions 10. As a result, production yield of the wiring substrate can be improved, and the wiring substrate whose reliability is high can be obtained.

As depicted in FIG. 8, in the wiring substrate 1 of the first embodiment, the composite substrate 5 functioning as the core substrate is arranged in the center part in the thickness direction. The composite substrate 5 includes the oxidized aluminum substrate portions 10 that are shaped squarely when viewed from the top, and the aluminum substrate portion 10x having a frame shape, provided around the oxidized aluminum substrate portion 10.

The oxidized aluminum substrate portions 10 are obtained by anodizing the aluminum substrate 10a, and a large number of through holes TH each of which penetrates the substrate in the thickness direction are provided in the oxidized aluminum substrate portions 10. The penetration conductor TC is filled in the through holes TH respectively, and the penetration conductors TC function as the penetration vias that enable the conduction between both surface sides of the oxidized aluminum substrate portion 10.

The first interlayer insulating layer 20 in which the first via holes VH1 are provided on the penetration conductors TC, which are caused to function as the penetration vias, out of a large number of penetration conductors TC provided in the oxidized aluminum substrate portion 10, is formed on both surface sides of the composite substrate 5 respectively. The penetration conductors TC covered with the first interlayer insulating layer 20 are electrically insulated mutually by the oxidized aluminum substrate portion 10 (insulator), and have no concern in the conduction between the upper and lower sides.

Also, the first wiring layer 30 connected to the upper end or the lower end of the penetration conductor TC via the first via hole VH1 is formed on the first interlayer insulating layer 20 on both surface sides respectively. The first wiring layer 30 is connected electrically to a plurality of penetration conductors TC in the connection parts between the first wiring layer 30 and the penetration conductors TC.

Also, the first wiring layer 30 is formed to include the first wiring portions 30a, and the first substrate reinforcing electrode portion 30b formed of the same layer as the first wiring portion 30a.

The first wiring portions 30a are arranged on both surface sides corresponding to the oxidized aluminum substrate portion 10, and are connected to the penetration conductors TC via the first via holes VH1. In contrast, the first substrate reinforcing electrode portion 30b is arranged on both surface sides corresponding to the aluminum substrate portion 10x, and is separated from the first wiring portions 30a.

Further, the second interlayer insulating layer 22 in which the second via hole VH2 is provided on the connection parts of the first wiring layer 30 respectively is formed on both surface sides of the composite substrate 5 respectively. The second wiring layer 32 connected to the first wiring layer 30 via the second via hole VH2 is formed on the second interlayer insulating layer 22 on both surface sides respectively.

Like the first wiring layer 30, the second wiring layer 32 is formed to include the second wiring portions 32a, and the second substrate reinforcing electrode portion 32b formed of the same layer as the second wiring portions 32a. Then, the second wiring portions 32a are arranged on both surface sides corresponding to the oxidized aluminum substrate portion 10, and are connected to the first wiring portions 30a of the first wiring layer 30 via the second via holes VH2 respectively. In contrast, the second substrate reinforcing electrode portion 32b is arranged on both surface sides corresponding to the aluminum substrate portion 10x, and is separated from the second wiring portion 32a.

The first and second substrate reinforcing electrode portions 30b, 32b are arranged with a ring-like connected pattern on the parts corresponding to the aluminum substrate portions 10x.

Also, the solder resist 24 in which the opening portion 24a is provided on the connection portions of the second wiring layer 32 respectively is formed on both surface sides of the composite substrate 5 respectively. The contact layer 34 formed of nickel/gold layers, or the like is formed on the connection parts of the second wiring layer 32 on both surface sides respectively.

Also, the bump electrodes 36 each connected to the contact layer 34 on the second wiring layer 32 are formed on both surface sides of the composite substrate 5 respectively.

In the wiring substrate 1 of the first embodiment, the first via holes VH1 in the first interlayer insulating layer 20 are arranged in any positions of the oxidized aluminum substrate portion 10 in which a large number of penetration conductors TC are provided in advance. Therefore, the penetration via structure that enable the conduction between both surface sides of the substrate can be easily constructed.

Also, the aluminum substrate portion 10x whose substrate strength is strong and which is shaped like a frame is provided and coupled around the oxidized aluminum substrate portions 10 in which a large number of penetration conductors TC are provided and whose substrate strength is weak. That is, in the wiring substrate 1 of the first embodiment, the stiffener (reinforcing plate) formed of the aluminum substrate portion 10x is coupled to the outer edge side of the wiring substrate, and strength of the substrate is reinforced.

As a result, strength of the substrate can be improved rather than the case where the oxidized aluminum substrate portion 10 is employed over the whole area (the related art).

Also, strength of the substrate can be improved from such a viewpoint that the first and second substrate reinforcing electrode portions 30b, 32b of the first and second wiring layer 30, 32 are arranged on both surface sides of the aluminum substrate portion 10x as the reinforcing member. Further, the wiring substrate 1 has a symmetric structure with respect to the composite substrate 5, and thus an occurrence of a warp can be prevented.

Also, the outer edge part of the oxidized aluminum substrate portion 10 in which a large number of penetration conductors TC are provided is protected by the aluminum substrate portion 10x, and is not exposed to the outside. As a result, even though a mechanical impact is applied to the end part of the wiring substrate 1, it is not feared that the defects are caused such that the penetration conductors TC fall to peel off, and the like, and also the wiring substrate with high reliability can be constructed.

In the wiring substrate 1 in FIG. 8, the bump electrodes 36 formed on the upper surface side serve as the chip connection parts connected to the semiconductor chip, and the bump electrodes 36 formed on the lower surface side serve as the external connection parts connected to the mounting substrate (the mother board, or the like).

Then, as depicted in FIG. 9, the connection parts of a semiconductor chip 40 (LSI chip) are flip-chip connected to the bump electrodes 36 formed on the upper surface side of the wiring substrate 1 in FIG. 8 by the reflow soldering. Also, an underfill resin may be filled in a clearance between the semiconductor chip 40 and the wiring substrate 1.

Accordingly, a semiconductor package (semiconductor device) 2 of the first embodiment is obtained. In the semiconductor package 2, for the similar reason, strength of the substrate can be improved and also high reliability can be obtained.

(Second Embodiment)

Figure 10A:
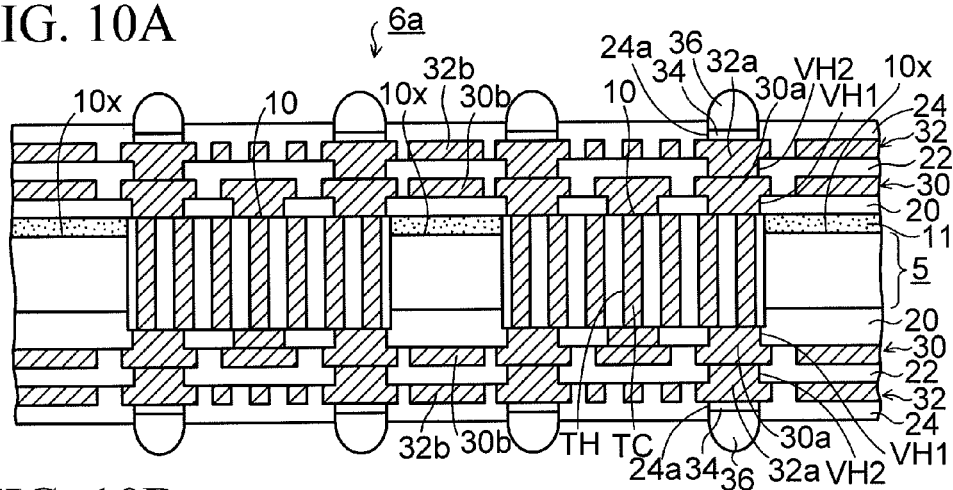
FIGS. 10A to 10C are sectional views depicting a method of manufacturing a wiring substrate and a semiconductor package according to a second embodiment.
Figure 10B:
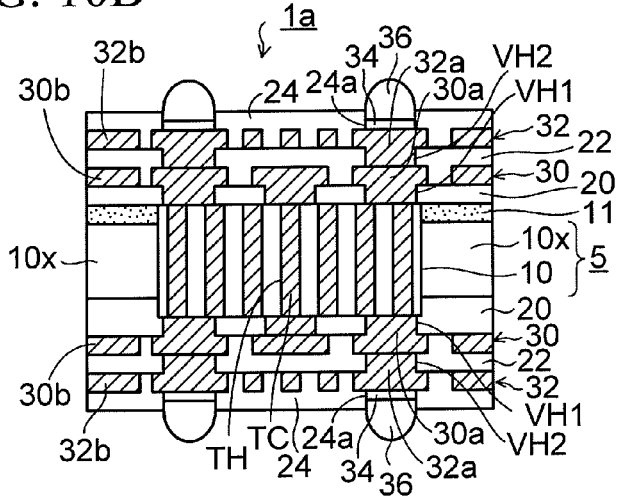
Figure 10C:
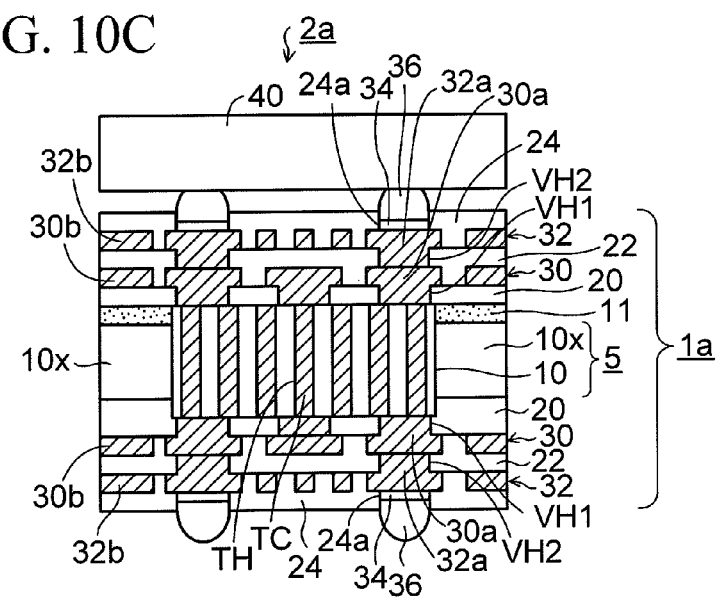

FIGS. 10A to 10C are sectional views depicting a method of manufacturing a wiring substrate and a semiconductor package according to a second embodiment.

A feature of the second embodiment resides in that the insulating resin layer 11 used as the above mask for the anodic oxidization in the first embodiment (FIG. 4B to FIG. 5A) is not removed and is still left.

Therefore, in the second embodiment, a wiring member 6a depicted in FIG. 10A is obtained. That is, the insulating resin layer 11 (the dot shaded portion) is left on the upper surface of the aluminum substrate portion 10x of the composite substrate 5, and then the first interlayer insulating layer 20 is formed on the insulating resin layer 11.

In the case that the insulating resin layer 11 is left as in the second embodiment, preferably a permanent resist that can be used as the interlayer insulating layer, as it is, is employed.

Then, as depicted in FIG. 10B, like the first embodiment, the wiring member 6a in FIG. 10A is cut in the dicing region D (FIG. 4B), and thus individual wiring substrates 1a are obtained.

The second embodiment is similar to the first embodiment except that the insulating resin layer 11 is left.

In the second embodiment, the step of removing the insulating resin layer 11 can be omitted. Therefore, a lower cost can be achieved rather than the first embodiment.

Then, as depicted in FIG. 10C, like the first embodiment, the connection parts of the semiconductor chip 40 are flip-chip connected to the bump electrodes 36 formed on the upper side of the wiring substrate 1a in FIG. 10B, and thus a semiconductor package (semiconductor device) 2a is constructed.

(Third Embodiment)

Figure 11A:
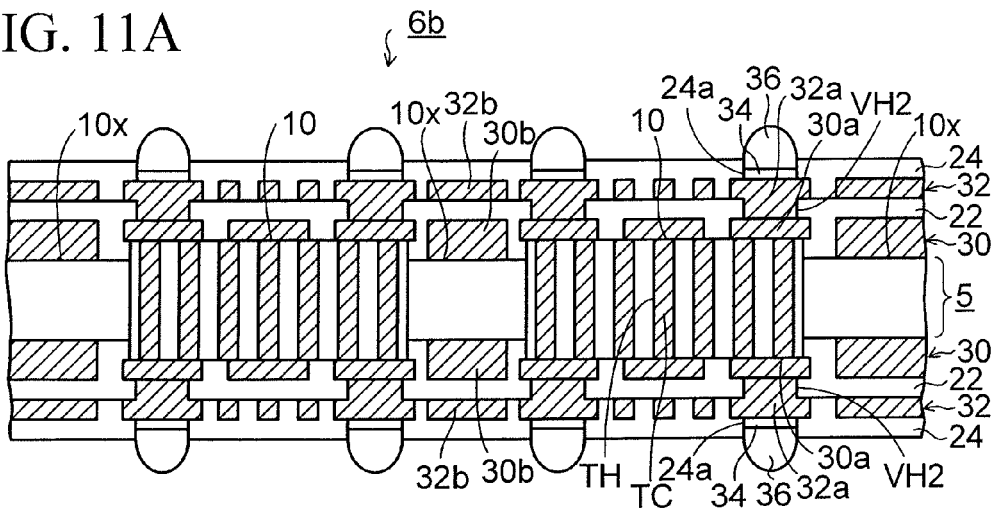
FIGS. 11A to 11C are sectional views depicting a method of manufacturing a wiring substrate and a semiconductor package according to a third embodiment.
Figure 11B:
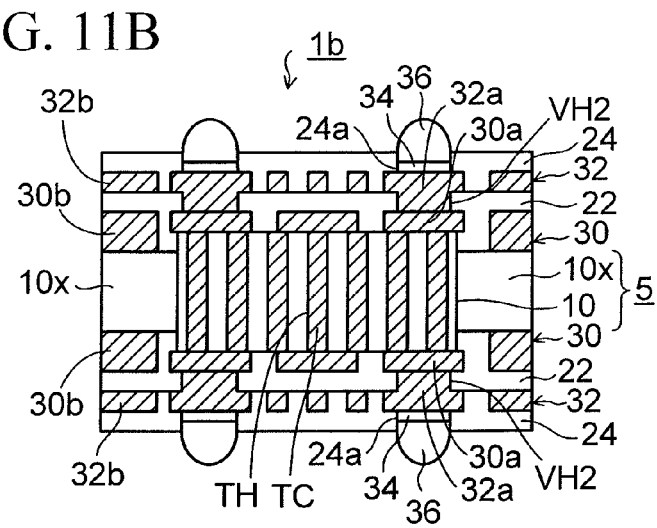
Figure 11C:
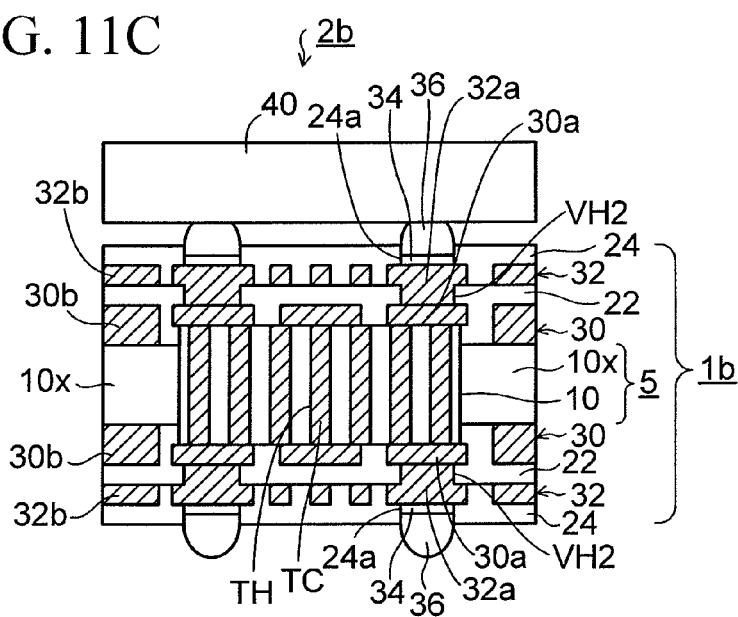

FIGS. 11A to 11C are sectional views depicting a method of manufacturing a wiring substrate and a semiconductor package according to a third embodiment.

As depicted in FIG. 11A, a feature of the third embodiment is that the first interlayer insulating layer 20 formed at first in the method of forming the build-up wiring layer BW in the above first embodiment (FIGS. 5C and 5D) is omitted.

Therefore, as depicted in FIG. 11A, in a wiring member 6b obtained in the third embodiment, the first wiring portions 30a of the first wiring layer 30 are formed directly on both surfaces of the oxidized aluminum substrate portion 10 without intervention of the first interlayer insulating layer 20, and also the first substrate reinforcing electrode portion 30b of the first wiring layer 30 is formed directly on both surfaces of the aluminum substrate portion 10x.

Then, as depicted in FIG. 11B, like the first embodiment, the wiring member 6b in FIG. 10A is cut in the dicing region D (FIG. 4B), and thus individual wiring substrates 1b are obtained.

In the third embodiment, the first substrate reinforcing electrode portion 30b of the first wiring layer 30 is formed to contact the aluminum substrate portion 10x. In this case, the first substrate reinforcing electrode portion 30b and the aluminum substrate portion 10x are not connected to the electric circuit, and therefore no trouble arises.

The third embodiment is similar to the first embodiment except the first interlayer insulating layer 20 is omitted.

In the third embodiment, the first substrate reinforcing electrode portion 30b is formed directly on both surfaces of the aluminum substrate portion 10x. Therefore, a thickness of the aluminum substrate portion 10x as reinforcement is substantially increased. As a result, strength of the substrate can be improved in contrast to the first and second embodiments.

Also, the steps of forming the first interlayer insulating layer 20 and the first via holes VH1 can be omitted. Therefore, a lower cost can be achieved rather than the first embodiment.

Then, as depicted in FIG. 11C, like the first embodiment, the connection parts of the semiconductor chip 40 are flip-chip connected to the bump electrodes 36 formed on the upper side of the wiring substrate 1b in FIG. 11B, and thus a semiconductor package (semiconductor device) 2b is constructed.

(Fourth Embodiment)

Figure 12A:
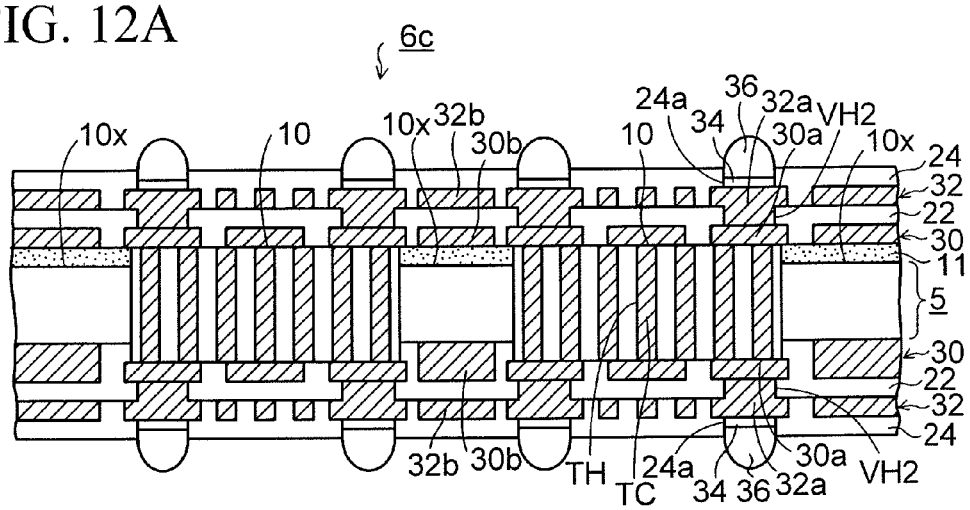
FIGS. 12A to 12C are sectional views depicting a method of manufacturing a wiring substrate and a semiconductor package according to a fourth embodiment.
Figure 12B:
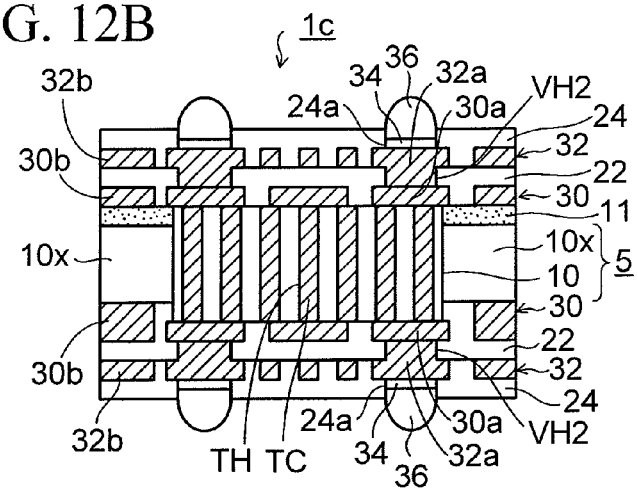
Figure 12C:
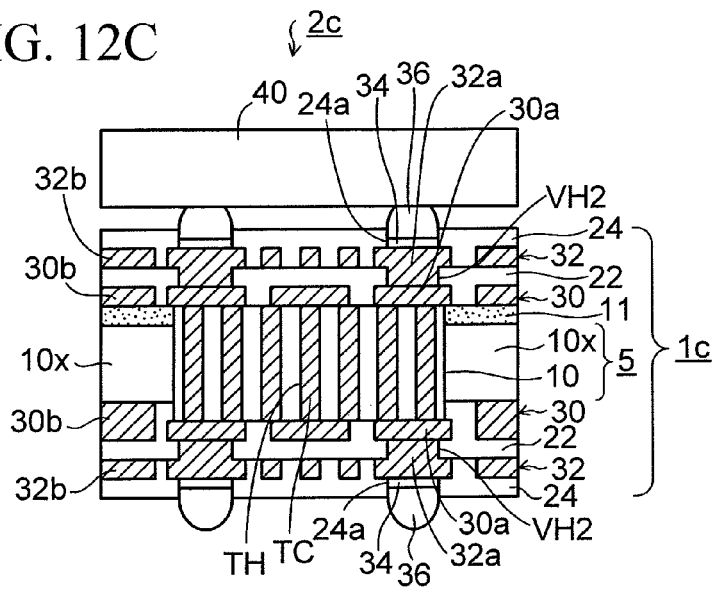

FIGS. 12A to 12C are sectional views depicting a method of manufacturing a wiring substrate and a semiconductor package according to a fourth embodiment.

A feature of the fourth embodiment resides in that, like the second embodiment, the insulating resin layer 11 (FIG. 4B to FIG. 5A) used as the mask for the anodic oxidation is still left and, like the third embodiment, the first interlayer insulating layer 20 of the build-up wiring layer BW (FIGS. 5C and 5D) is omitted.

Therefore, as depicted in FIG. 12A, in a wiring member 6c obtained in the fourth embodiment, the first wiring portions 30a of the first wiring layer 30 are formed directly on both surfaces of the oxidized aluminum substrate portion 10 without intervention of the first interlayer insulating layer 20. Also, in the upper surface side of the aluminum substrate portion 10x, the first substrate reinforcing electrode portion 30b of the first wiring layer 30 is formed via the insulating resin layer 11 (the dot shaded portion), but in the lower surface side of the aluminum substrate portion 10x, the first substrate reinforcing electrode portion 30b is formed directly without intervention of the insulating layer.

Then, as depicted in FIG. 12B, like the first embodiment, the wiring member 6c in FIG. 12A is cut in the dicing region D (FIG. 4B), and thus individual wiring substrates 1c are obtained.

The fourth embodiment is similar to the first embodiment except the insulating resin layer 11 is left and the first interlayer insulating layer 20 is omitted.

In the fourth embodiment, the step of removing the insulating resin layer 11, the step of forming the first interlayer insulating layer 20, and the step of forming the first via holes VH1 can be omitted. Therefore, a lower cost can be achieved rather than the first to third embodiments.

Then, as depicted in FIG. 12C, like the first embodiment, the connection parts of the semiconductor chip 40 are flip-chip connected to the bump electrodes 36 formed on the upper side of the wiring substrate 1c in FIG. 12B, and thus a semiconductor package (semiconductor device) 2c is formed.

(Other Embodiment)

In the above-mentioned first to fourth embodiments, the wiring substrate is manufactured by building the build-up wiring layer BW onto the composite substrate 5. As other mode, the wiring member (the wiring substrate) may be manufactured based on preparing in advance the wiring member having the connection part apart from the composite substrate 5, and then bonding the connection parts of the wiring member onto the penetration conductor TC of the composite substrate 5 by using conductive material such as solder, or the like.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate, comprising:
   a composite substrate including an oxidized aluminum substrate portion in which a large number of penetration conductors penetrating in a thickness direction are provided, and a frame-like aluminum substrate portion provided around the oxidized aluminum substrate portion,
   wherein, the oxidized aluminum substrate portion is surrounded by the aluminum substrate portion, and is not exposed to a side part of the wiring substrate; and
   a wiring layer of n layers (n is an integer of 1 or more) connected to the penetration conductors,
   the wiring layer includes
   a wiring portion which is arranged in a part corresponding to the oxidized aluminum substrate portion and is connected to the penetration conductors, and
   a substrate reinforcing electrode portion which is arranged in a part corresponding to the aluminum substrate portion and is separated from the wiring portion.

2. A wiring substrate according to claim 1, wherein the wiring layer is connected electrically to a plurality of said penetration conductors in a connection part between the wiring layer and the penetration conductors.

3. A wiring substrate according to claim 1, wherein the substrate reinforcing electrode portion is arranged with a ring-like connected pattern.

4. A wiring substrate, comprising:
   a composite substrate including an oxidized aluminum substrate portion in which a large number of penetration conductors penetrating in a thickness direction are provided, and a frame-like aluminum substrate portion provided around the oxidized aluminum substrate portion,
   wherein, an outer edge part of the oxidized aluminum substrate portion is surrounded by the aluminum substrate portion;
   a wiring layer of n layers (n is an integer of 1 or more) connected to the penetration conductors,
   the wiring layer including,
   a wiring portion which is arranged in a part corresponding to the oxidized aluminum substrate portion and is connected to the penetration conductors, and
   a substrate reinforcing electrode portion which is arranged in a part corresponding to the aluminum substrate portion and is separated from the wiring portion, wherein the substrate reinforcing electrode portion is formed like a ring shape so as to surround the oxidized aluminum substrate, and is formed on or under the aluminum substrate portion.

* * * * *